US010049910B2

(12) United States Patent
Kirino et al.

(10) Patent No.: US 10,049,910 B2
(45) Date of Patent: Aug. 14, 2018

(54) MANUFACTURING METHOD OF SEMICONDUCTOR DEVICE AND SEMICONDUCTOR MANUFACTURING APPARATUS USING A CONVEYING ROBOT CONVEYING A SEMICONDUCTOR SUBSTRATE

(71) Applicant: Renesas Electronics Corporation, Tokyo (JP)

(72) Inventors: Ryuji Kirino, Ibaraki (JP); Shinji Nakaguma, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/284,705

(22) Filed: Oct. 4, 2016

(65) Prior Publication Data

US 2017/0125279 A1    May 4, 2017

(30) Foreign Application Priority Data

Oct. 29, 2015    (JP) .................................. 2015-213451

(51) Int. Cl.
*H01L 21/687*    (2006.01)
*H01L 21/67*    (2006.01)
(Continued)

(52) U.S. Cl.
CPC .... *H01L 21/68707* (2013.01); *H01L 21/6773* (2013.01); *H01L 21/67265* (2013.01);
(Continued)

(58) Field of Classification Search
CPC ......... H01L 21/68707; H01L 21/67265; H01L 21/67306; H01L 21/68771; H01L 21/67346; H01L 21/6773; H01L 21/67057
See application file for complete search history.

(56) References Cited

U.S. PATENT DOCUMENTS 538,127 A * 4/1895 Schneider ........... E05B 47/0047
292/341.16
4,556,584 A * 12/1985 Sarkozy .............. C23C 16/4412
427/248.1
(Continued)

FOREIGN PATENT DOCUMENTS

JP        10-84028 A    3/1998
JP        10-223733 A    8/1998

*Primary Examiner* — Kyoung Lee
*Assistant Examiner* — Christina Sylvia
(74) *Attorney, Agent, or Firm* — Sughrue Mion, PLLC

(57) ABSTRACT

An object of the present invention is to prevent a semiconductor substrate from being damaged when the substrate is conveyed by a conveying robot provided in a semiconductor manufacturing apparatus.

A diffusion furnace apparatus has a diffusion furnace that processes a semiconductor wafer, a quartz boat that is arranged in the diffusion furnace to store the semiconductor wafer, and a conveying robot that delivers the semiconductor wafer between the quartz boat and a cassette carried in from the outside. Further, the conveying robot includes a column-like sensor support unit provided at a part that is not turned, and a first sensor that detects the presence or absence of the semiconductor wafer held on a plate of the conveying robot and a second sensor that detects the positional displacement of the semiconductor wafer held on the plate are provided at the sensor support unit.

13 Claims, 8 Drawing Sheets

(51) Int. Cl.
*H01L 21/673* (2006.01)
*H01L 21/677* (2006.01)

(52) U.S. Cl.
CPC .. *H01L 21/67306* (2013.01); *H01L 21/67346* (2013.01); *H01L 21/68771* (2013.01); *H01L 21/67057* (2013.01)

(56) References Cited

U.S. PATENT DOCUMENTS

| | | | | |
|---|---|---|---|---|
| 4,658,193 | A * | 4/1987 | Low | G05B 19/4083 318/568.17 |
| 8,696,298 | B2 * | 4/2014 | van der Meulen | H01L 21/6719 414/805 |
| 2004/0231600 | A1 * | 11/2004 | Lee | H01L 21/67259 118/729 |
| 2005/0096794 | A1 * | 5/2005 | Yim | H01L 21/67259 700/258 |
| 2009/0246472 | A1 * | 10/2009 | Kanai | B05D 7/14 428/161 |

* cited by examiner

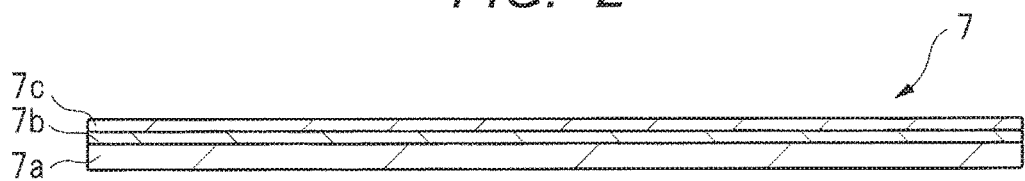
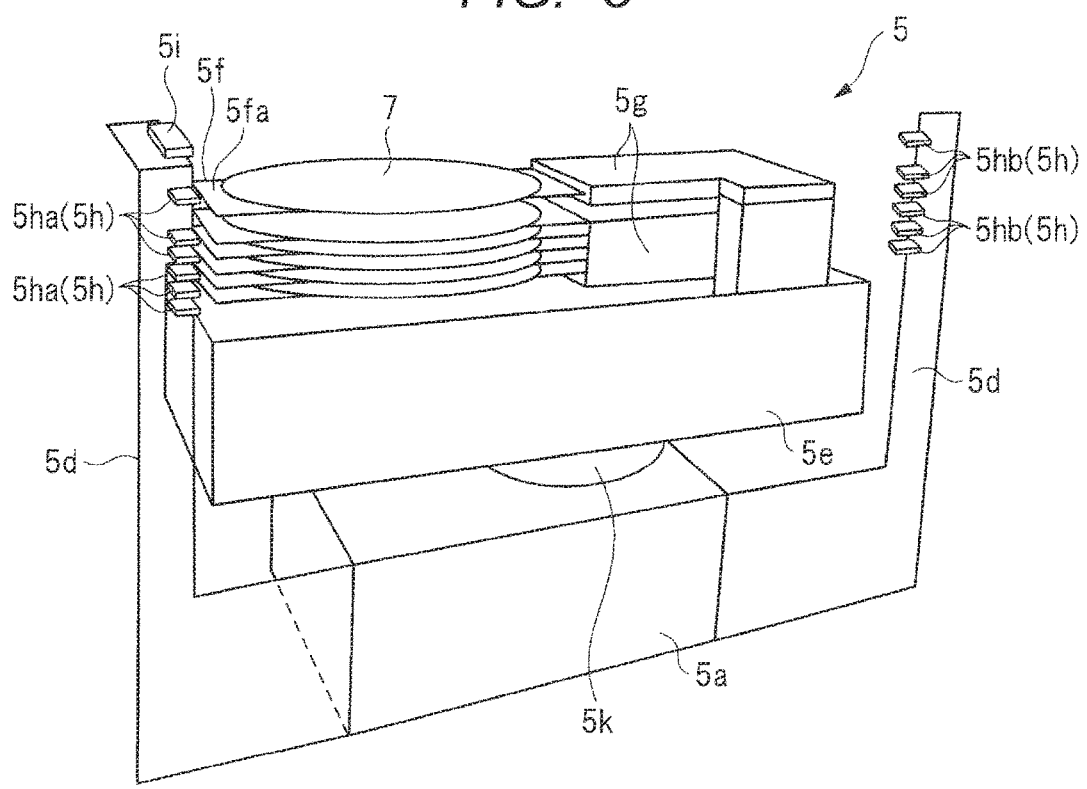

MANUFACTURING METHOD OF SEMICONDUCTOR DEVICE AND SEMICONDUCTOR MANUFACTURING APPARATUS USING A CONVEYING ROBOT CONVEYING A SEMICONDUCTOR SUBSTRATE

CROSS-REFERENCE TO RELATED APPLICATIONS

The disclosure of Japanese Patent Application No. 2015-213451 filed on Oct. 29, 2015 including the specification, drawings and abstract is incorporated herein by reference in its entirety.

BACKGROUND

The present invention relates to, for example, a manufacturing technique of a semiconductor device and a semiconductor manufacturing apparatus using a conveying robot conveying a semiconductor substrate.

In a semiconductor manufacturing apparatus used in a manufacturing line of a semiconductor wafer (a semiconductor substrate, or hereinafter simply referred to as a wafer), the semiconductor substrate is conveyed by a conveying robot between a substrate carrying-in/carrying-out unit and a processing unit in the apparats in many cases.

A substrate conveying apparatus (wafer conveying apparatus) using a conveying robot and the like conveying a semiconductor substrate is disclosed in, for example, Japanese Unexamined Patent Application Publication No. Hei 10 (1998)-84028 and Japanese Unexamined Patent Application Publication No. Hei 10 (1998)-223733.

However, if the semiconductor substrate is processed at high temperature while being stored in, for example, a substrate storage unit such as a boat in the processing unit of the semiconductor manufacturing apparatus, the semiconductor substrate is warped and deformed. In addition, when attempting to take out the semiconductor substrate from the substrate storage unit using the conveying robot, the semiconductor substrate is caught in the substrate storage unit, and cannot be taken out from the substrate storage unit. Thus, the semiconductor substrate is left in the substrate storage unit.

In the sequence of the conveying robot, the conveying robot performs an operation of taking out the semiconductor substrate from the substrate storage unit, and then performs the next operation, namely, an operation of storing the semiconductor substrate into the substrate storage unit. In this case, a semiconductor substrate that could not be taken out is left in the substrate storage unit, and the semiconductor substrate to be stored is overlapped with one that is left. As a result, the semiconductor substrate is disadvantageously damaged.

The other objects and novel features will become apparent from the description of the specification and the accompanying drawings.

A manufacturing method of a semiconductor device according to an aspect of the present invention includes the steps of: (a) delivering a semiconductor substrate using a conveying robot provided in a semiconductor manufacturing apparatus between a processing jig included in the semiconductor manufacturing apparatus and a substrate storage container; and (b) performing a desired process for the semiconductor substrate in a processing unit of the semiconductor manufacturing apparatus. Further, the conveying robot includes a sensor support unit provided at a part that is not turned, and a first sensor that detects the presence or absence of the semiconductor substrate held by a substrate holding unit of the conveying robot and a second sensor that detects the positional displacement of the semiconductor substrate held by the substrate holding unit are provided at the sensor support unit. Furthermore, the first sensor detects the presence or absence of the semiconductor substrate, and the second sensor detects the positional displacement of the semiconductor substrate in the step (a).

Further, a semiconductor manufacturing apparatus according to another aspect of the present invention includes: a processing unit that processes a semiconductor substrate; a processing jig that is arranged in the processing unit to store the semiconductor substrate; and a conveying robot that delivers the semiconductor substrate between the processing jig and a substrate storage container carried in from the outside. The processing jig is a jig that stores the semiconductor substrate when a desired process is performed for the semiconductor substrate in the processing unit. Further, the conveying robot includes a sensor support unit provided at a part that is not turned, and a first sensor that detects the presence or absence of the semiconductor substrate held by a substrate holding unit of the conveying robot and a second sensor that detects the positional displacement of the semiconductor substrate held by the substrate holding unit are provided at the sensor support unit.

According to the above-described aspects of the present invention, mistakes in the conveyance of a semiconductor substrate by a conveying robot can be reduced, and the substrate can be prevented from being damaged when the substrate is conveyed.

BRIEF DESCRIPTION OF THE DRAWINGS

FIG. 2 is a cross-sectional view for showing an example of a structure of a semiconductor substrate with a film formed using the semiconductor manufacturing apparatus shown in FIG. 1;

FIG. 3 is a schematic view for showing an example of a structure of a conveying robot provided in the semiconductor manufacturing apparatus shown in FIG. 1;

DETAILED DESCRIPTION

Figure 1:
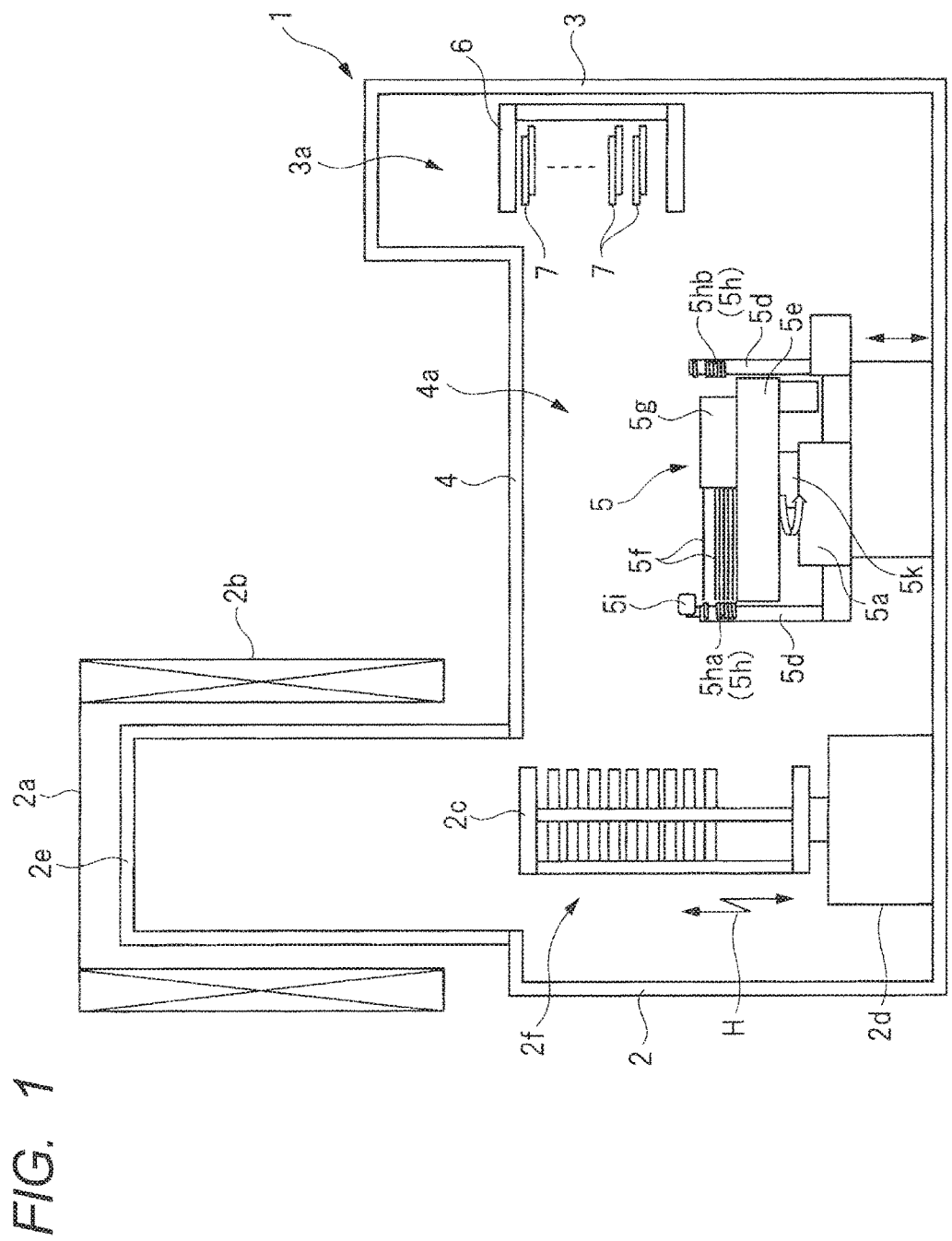
FIG. 1 is a schematic view for showing a structure of a diffusion furnace apparatus (vertical furnace apparatus) that is an example of a semiconductor manufacturing apparatus according to a first embodiment.

In the following embodiments, the explanations of the same or similar components will not be repeated in principle if not necessary.

Further, the present invention will be described in the following embodiments while being divided into a plurality of sections or embodiments if necessary for convenience sake. However, except for a case especially specified, the sections or embodiments are not irrelevant to each other, and one has a relationship as a part of a modified example or a complete modified example, or a detailed or supplementary explanation of the other.

Further, if the specification refers to the number of elements (including the number of pieces, values, amounts, ranges, and the like) in the following embodiments, the present invention is not limited to the specific number, but may be smaller or larger than the specific number, except for a case especially specified or a case obviously limited to the specific number in principle.

Furthermore, it is obvious that the components (including elemental steps and the like) are not necessarily essential in the following embodiments, except for a case especially specified or a case obviously deemed to be essential in principle.

Further, it is obvious that "composed of A", "consisting of A", "having A", and "including A" in terms of components in the following embodiments do not exclude the other components except for a case in which only the "A" is specified. Likewise, if the specification refers to the shapes or positional relationships of components in the following embodiments, the present invention includes those that are substantially close or similar to components in shapes and the like, except for a case especially specified or a case obviously deemed not to be close or similar in principle. The same applies to the values and ranges.

Hereinafter, embodiments of the present invention will be described in detail on the basis of the drawings. It should be noted that members having the same functions are given the same reference numerals in all the drawings for explaining the embodiments, and the repeated explanations thereof will be omitted. Further, hatchings are illustrated in some cases even in the case of plan views in order to easily view the drawings.

(First Embodiment)

Figure 4:
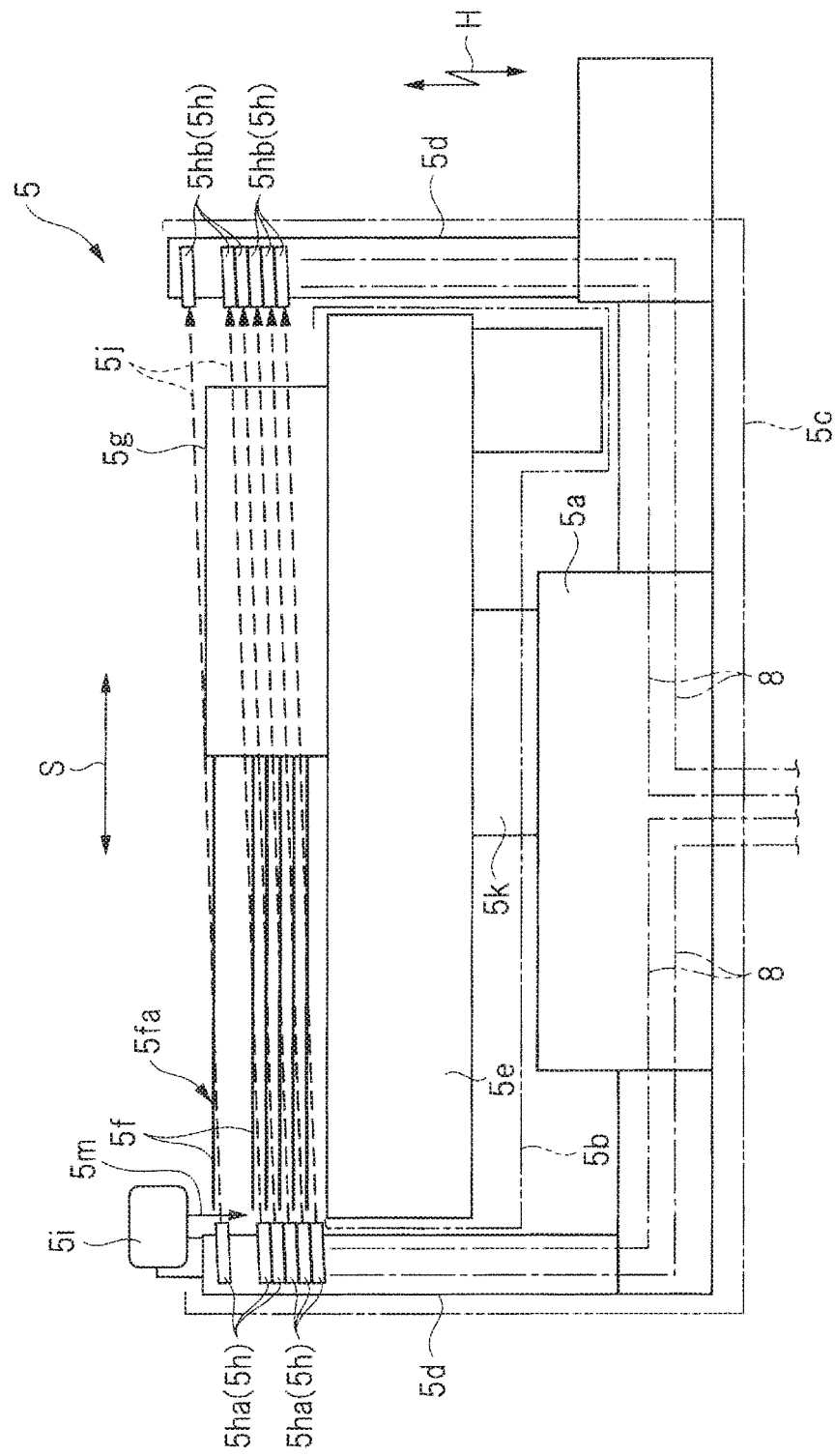
FIG. 4 is a side view for showing an example of a structure of the conveying robot shown in FIG. 3.
Figure 5:
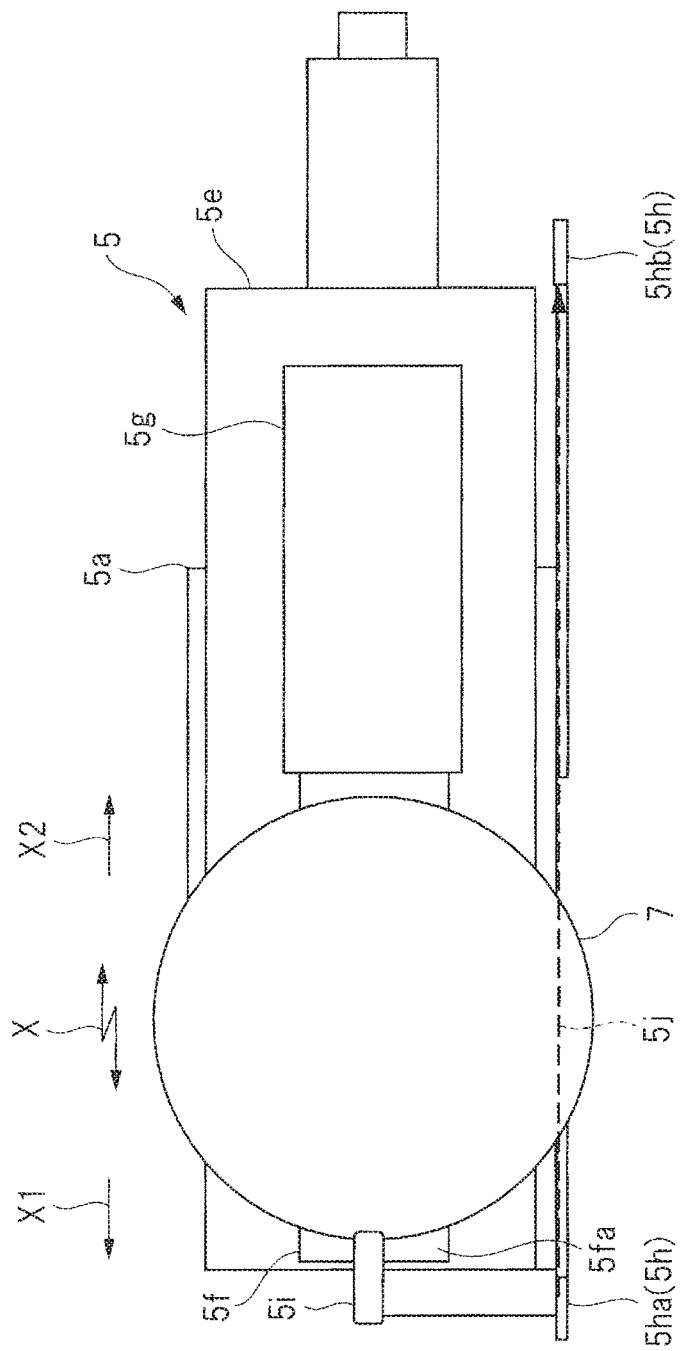
FIG. 5 is a plan view for showing an example of a structure of the conveying robot shown in FIG. 3.

FIG. 1 is a schematic view for showing a structure of a diffusion furnace apparatus (vertical furnace apparatus) that is an example of a semiconductor manufacturing apparatus according to a first embodiment, and FIG. 2 is a cross-sectional view for showing an example of a structure of a semiconductor substrate with a film formed using the semiconductor manufacturing apparatus shown in FIG. 1. Further, FIG. 3 is a schematic view for showing an example of a structure of a conveying robot provided in the semiconductor manufacturing apparatus shown in FIG. 1, FIG. 4 is a side view for showing an example of a structure of the conveying robot shown in FIG. 3, and FIG. 5 is a plan view for showing an example of a structure of the conveying robot shown in FIG. 3.

<Semiconductor Manufacturing Apparatus>

The semiconductor manufacturing apparatus of the first embodiment shown in FIG. 1 performs a desired process such as a film formation process for a semiconductor wafer 7 that is a semiconductor substrate. In the first embodiment, a diffusion furnace apparatus (vertical furnace apparatus) 1 that forms an oxide film 7b on a silicon substrate 7a in a high temperature atmosphere as shown in FIG. 2 will be described as an example. However, the semiconductor manufacturing apparatus may be a film formation apparatus having a vertical furnace such as a CVD (Chemical Vapor Deposition) apparatus that forms a polysilicon film 7c or a nitride film on the oxide film 7b.

A configuration of the diffusion furnace apparatus 1 shown in FIG. 1 will be described. The diffusion furnace apparatus 1 has a diffusion furnace 2a that is a processing unit for performing the film formation process for the semiconductor wafer 7, and a boat chamber unit 2f that is covered with a boat chamber 2 to deliver a plurality of semiconductor wafers 7 to an installed quartz boat 2c. Further, the diffusion furnace apparatus 1 has a substrate carrying-in/carrying-out unit 3a in which a cassette (substrate storage container) 6 having the semiconductor wafers 7 stored or an empty cassette 6 is arranged and which is covered with a cassette chamber 3, and a substrate conveying unit 4a which is covered with a conveying chamber 4 provided between the boat chamber 2 and the cassette chamber 3 and in which a conveying robot 5 delivering the semiconductor wafers 7 between the cassette 6 and the quartz boat 2c is installed.

Namely, the diffusion furnace apparatus 1 has the diffusion furnace (processing unit) 2a, the boat chamber unit 2f, the substrate conveying unit 4a, and the substrate carrying-in/carrying-out unit 3a.

Next, details of each unit will be described. A reaction tube 2e is provided in the diffusion furnace 2a, and further a furnace body heater 2b is attached to the outside of the reaction tube 2e. Accordingly, the inside of the reaction tube 2e is heated to a desired temperature by the furnace body heater 2b to form a high temperature atmosphere in the film formation process, and further a reactive gas is supplied to the reaction tube 2e to perform the film formation process.

Further, the quartz boat 2c that is a processing jig in which the semiconductor wafers 7 can be stored is arranged in the boat chamber unit 2f. The quartz boat 2c is installed on a boat elevator 2d in such a manner that the height thereof can be adjusted with the conveying robot 5 when the semiconductor wafers 7 are delivered by the conveying robot 5. Namely, the quartz boat 2c is installed so as to be vertically moved by the boat elevator 2d, and is moved up to the inside of the reaction tube 2e of the diffusion furnace 2a by the boat elevator 2d in the film formation process. In addition, the reactive gas is supplied in a high temperature atmosphere to perform the film formation process. Namely, the semiconductor wafers 7 are moved to the inside of the reaction tube 2e in a state where the semiconductor wafers 7 are stored in the quartz boat 2c to perform the film formation process, and the diffusion furnace apparatus 1 of the first embodiment performs the film formation process using a batch system. As an example, the film formation process can be performed for up to about 100 semiconductor wafers 7 at a time.

Further, the substrate carrying-in/carrying-out unit 3a serves as an area in which the cassette 6 storing the semiconductor wafers 7 or the empty cassette 6 storing no semiconductor wafers 7 is arranged.

In addition, the conveying robot 5 conveying the semiconductor wafers 7 is installed in the substrate conveying unit 4a, and the semiconductor wafers 7 are delivered by the conveying robot 5 between the quartz boat 2c and the cassette 6 carried in from the outside of the diffusion furnace apparatus 1.

In the diffusion furnace apparatus 1 of the first embodiment as described above, for example, five of the semiconductor wafers 7 stored in the cassette 6 are simultaneously taken out by the conveying robot 5, and are transferred to the quartz boat 2c by the conveying robot 5 as they are. After repeating the operation, the quartz boat 2c storing up to about 100 semiconductor wafers 7 is moved up to the inside of the reaction tube 2e by the boat elevator 2d, and the reactive gas is supplied to the reaction tube 2e to perform the film formation process. In this case, the inside of the reaction tube 2e is in a high temperature atmosphere by being heated up to a desired temperature by the furnace body heater 2b.

In addition, after the film formation process, the quartz boat 2c is moved down to the boat chamber unit 2f by the boat elevator 2d. Then, for example, five of the semiconductor wafers 7 stored in the quartz boat 2c are simultaneously taken out from the quartz boat 2c by the conveying robot 5, and the five semiconductor wafers 7 after the film formation process are transferred to the empty cassette 6 carried into the substrate carrying-in/carrying-out unit 3a by the conveying robot 5 as they are. All the semiconductor wafers 7 in the quartz boat 2c are transferred to the cassette 6 by repeating the transfer operation by the conveying robot 5.

<Conveying Robot>

Next, the conveying robot 5 of the first embodiment will be described using FIG. 3 to FIG. 5.

The conveying robot 5 includes a pedestal 5a serving as a base thereof, a first part 5b shown in FIG. 4 that is provided on the pedestal 5a through a turning axis 5k to be turned, and a second part 5c that is not turned. Namely, the first part 5b is a part having a plate (a substrate holding unit, or referred to as a blade or a tweezer) 5f on which the semiconductor wafers 7 (see FIG. 3) of the conveying robot 5 are mounted, and is turned. It should be noted that the first part 5b includes a part that is moved in the longitudinal direction X (the direction in which the semiconductor wafers 7 are delivered) shown in FIG. 5.

On the other hand, the second part 5c is a part that is neither turned nor moved in the longitudinal direction X, and is attached to the pedestal 5a so as to be vertically moved. Further, the second part 5c includes column-like sensor support units 5d where a first sensor 5h that detects the presence or absence of the semiconductor wafer 7 held on a plate 5f of the conveying robot 5 and a second sensor 5i that detects the positional displacement of the semiconductor wafer 7 held on the plate 5f are provided.

It should be noted that the column-like sensor support units 5d are provided along the vertical direction (the arrangement direction (height direction H) of the semiconductor wafers 7) on the substrate delivery side of the plate 5f of the first part 5b shown in FIG. 4 and on the base end side opposite thereto. Namely, the column-like sensor support units 5d are provided along the arrangement direction (the height direction H that is the vertical direction) of the semiconductor wafers 7 on the both sides of the front side X1 (the substrate delivery side) in the longitudinal direction X of the plate 5f shown in FIG. 5 and the rear side X2 (the base end side) of the plate 5f.

Further, as shown in FIG. 4, a turning block 5e is provided on the turning axis 5k in the first part 5b, and further a plate support unit 5g supporting a plurality of plates 5f is provided on the upper surface of the turning block 5e so as to be movable in the longitudinal direction (the direction in which the semiconductor substrate is delivered) X shown in FIG. 5.

Accordingly, the turning block 5e is turned in the conveying robot 5 so that the plate 5f provided on the turning block 5e can face in the direction in which the cassette 6 is arranged or in the direction in which the quartz boat 2c is arranged.

Further, as shown in FIG. 4, five plates 5f are attached to the plate support unit 5g at predetermined pitches so that, for example, five semiconductor wafers 7 shown in FIG. 5 can be simultaneously delivered in the conveying robot 5.

Namely, the conveying robot 5 includes a plurality (five or six) of comb teeth-like plates 5f on which the substrates are mounted.

Accordingly, when the plate support unit 5g is moved in the longitudinal direction X on the turning block 5e, five semiconductor wafers 7 can be simultaneously delivered (conveyed) to the quartz boat 2c or the cassette 6.

Further, another plate 5f is attached to the plate support unit 5g above the five plates 5f. When the plate support unit 5g is longitudinally moved, the uppermost plate 5f can be also longitudinally moved. In addition, a substrate mounting surface 5fa on which the semiconductor wafer 7 is mounted is formed on each of the six plates 5f, and the semiconductor wafer 7 is conveyed while being mounted on the substrate mounting surface 5fa.

The uppermost plate 5f is provided so as to be independently movable in the longitudinal direction X unlike the five plates 5f provided underneath. For example, when the semiconductor wafers 7 are short by one during the delivery operation of the semiconductor wafers 7 by the conveying robot 5, only the uppermost plate 5f is operated to refill the part of the shortage with the semiconductor wafer 7. Namely, it is possible to refill only one semiconductor wafer 7 by singly operating the uppermost plate 5f.

Next, the first sensor 5h and the second sensor 5i provided in the second part 5c of the conveying robot 5 that is neither turned nor longitudinally moved will be described.

As shown in FIG. 4 and FIG. 5, the first sensor 5h has light projecting units 5ha that emit light 5j and light receiving units 5hb that receive the light 5j. The light projecting units 5ha and the light receiving units 5hb are provided to face each other on the front side X1 (substrate delivery side) of the plate 5f shown in FIG. 4 and the rear side X2 (base end side) opposite thereto, respectively.

In the structure shown in each of FIG. 3 to FIG. 5, the light projecting units 5ha that emit the light 5j are provided at the column-like sensor support unit 5d arranged on the front side X1 of the plate 5f, and the light receiving units 5hb that receive the light 5j are provided at the column-like sensor support unit 5d arranged on the rear side X2 of the plate 5f.

Accordingly, as shown in FIG. 5, in the case where the light 5j emitted from the light projecting unit 5ha is blocked by the semiconductor wafer 7, the light 5j cannot be received by the light receiving unit 5hb. Thus, it is determined that the semiconductor wafer 7 is present. On the contrary, in the case where the light 5j emitted from the light projecting unit 5ha is not blocked by the semiconductor wafer 7 but is received by the light receiving unit 5hb, it is determined that the semiconductor wafer 7 is not mounted on the plate 5f.

As described above, whether or not the semiconductor wafer 7 is mounted on the plate 5f, namely, the presence or absence of the semiconductor wafer 7 on each plate 5f is determined (detected).

It should be noted that the first sensor 5h that is a set of sensors including the light projecting units 5ha and the light receiving units 5hb is provided in such a manner that the light projecting units 5ha and the light receiving units 5hb are provided on a one-on-one basis on the front side X1 (substrate delivery side) and the rear side X2 (base end side), respectively, in association with each of the plates 5f arranged at predetermined pitches in the vertical direction.

In the case of the structure shown in FIG. 4, six plates 5f are arranged in the first part 5b. Thus, six first sensors 5h are attached to the column-like sensor support units 5d on the front side X1 and the rear side X2 in association with each of the plates 5f.

In this case, each of the first sensors 5*h* is attached to the corresponding position (height) in the height direction H of the plates 5*f*. Further, in the first sensor 5*h* of the first embodiment, the light projecting unit 5*ha* is provided so that the light 5*j* is obliquely emitted relative to the horizontal direction S as shown in FIG. 4.

Namely, in order to further widen the range of detecting the presence or absence of the semiconductor wafer 7, the light projecting unit 5*ha* is provided so that the light 5*j* is obliquely emitted relative to the horizontal direction S, and the light receiving unit 5*hb* is provided at the position (height) where the light 5*j* obliquely emitted relative to the horizontal direction S can be received.

In other words, the light projecting unit 5*ha* is obliquely attached to the sensor support unit 5*d* on the front side X1 so that the emitted light 5*j* obliquely crosses the semiconductor wafer 7 in the side view shown in FIG. 4. On the other hand, the light receiving unit 5*hb* is also obliquely attached to the sensor support unit 5*d* on the rear side X2 so that the oblique light 5*j* can be received.

Therefore, as shown in FIG. 4, the attachment positions (attachment heights) of one set of the light projecting unit 5*ha* and the light receiving unit 5*hb* to the column-like sensor support units 5*d* are slightly displaced in the height direction H (not a horizontal position).

This configuration can be easily realized by inclining the attachment postures of the light projecting unit 5*ha* and the light receiving unit 5*hb* to the sensor support units 5*d* relative to the horizontal direction S.

Next, the second sensor 5*i* will be described.

The second sensor 5*i* is attached so that light 5*m* is emitted to the semiconductor wafer 7 held on the plate 5*f* of the conveying robot 5 along the vertical direction (height direction H) on the front side X1 (substrate delivery side) of the plate 5*f* as shown in FIG. 4 and FIG. 5.

Namely, the second sensor 5*i* is attached so that the light 5*m* is emitted from the upper direction of the uppermost semiconductor wafer 7 along a row of wafers near the outer periphery of the wafer on the front side X1 of the plate 5*f* holding the semiconductor wafer 7 and along the vertical direction (height direction H) at a position slightly apart outward from the wafer 7. It should be noted that the second sensor 5*i* is, for example, a light reflective sensor that includes a light projecting/receiving unit, emits the light 5*m*, and can detect a reflection distance by receiving the light 5*m* reflected from an object.

For example, in the case where the light is reflected from a position apart by a predetermined distance, the second sensor 5*i* does not particularly detect the light, but determines that the wafer 7 is not displaced. On the other hand, in the case where the light is reflected from a position apart by a distance shorter than the predetermined distance, the second sensor 5*i* detects the light, and determines that any one of the wafers 7 mounted on the plates 5*f* is displaced.

Namely, in the case where any one of the wafers 7 is displaced, the light 5*m* is reflected around an end of the displaced wafer 7. Thus, the light 5*m* is reflected from a position apart by a distance shorter than the predetermined distance. Accordingly, the second sensor 5*i* detects the light, and determines that the wafer is displaced. On the other hand, in the case where no wafer 7 is displaced, the light 5*m* is always reflected from a position apart by a predetermined distance, and thus the second sensor 5*i* does not particularly detect the light.

For example, in the case where the reflection distance is 100 when no wafer is displaced, the reflection distance when the wafer is displaced is sufficiently smaller than 100 (for example, 60, 70, or the like). In this case, the second sensor 5*i* detects an abnormality. It should be noted that a wall (step) is provided on the rear side X2 of the plate 5*f*, and thus the semiconductor wafer 7 is not displaced towards the rear side X2. Namely, if the wafer is displaced, the wafer is displaced towards the front side X1.

Thus, the second sensor 5*i* is preferably attached above the uppermost semiconductor wafer 7 so that the light 5*m* is emitted to a position slightly apart from the plate 5*f* on the front side X1 of the plate 5*f*.

It should be noted that in the case where, at least, one of the wafers 7 is displaced when the substrate is conveyed in the detection of the positional displacement of the wafer 7, the second sensor 5*i* detects the positional displacement, and then the conveying robot 5 temporarily stops.

In the manufacturing method of the semiconductor device according to the first embodiment using the diffusion furnace apparatus 1 as described above, when the wafer 7 is delivered by the conveying robot 5 provided in the diffusion furnace apparatus 1 between the quartz boat (processing jig) 2*c* included in the diffusion furnace apparatus 1 and the cassette (substrate storage container) 6 carried in from the outside, the first sensor 5*h* detects the presence or absence of the wafer 7, and further the second sensor 5*i* detects the positional displacement of the wafer 7.

In addition, the monitoring of the presence or absence of the wafer 7 and the monitoring of the positional displacement of the wafer 7 are performed during the conveying operation of the wafer 7 by the conveying robot 5.

According to the diffusion furnace apparatus 1 and the manufacturing method of the semiconductor device according to the first embodiment, the first sensor 5*h* detecting the presence or absence of the wafer 7 and the second sensor 5*i* detecting the positional displacement of the wafer 7 are provided in the conveying robot 5 included in the diffusion furnace apparatus 1. Accordingly, the presence or absence of the wafer 7 and the positional displacement of the wafer 7 can be detected in a series of delivery operations of the wafer 7 by the conveying robot 5.

Accordingly, mistakes in the conveyance of the wafer 7 by the conveying robot 5 can be reduced, and the wafer 7 can be prevented from being damaged when the wafer is conveyed.

Further, the first sensor 5*h* and the second sensor 5*i* are provided at the sensor support units 5*d* of the second part 5*c* (that is not turned) whose operation system is separated from that of the first part 5*b* of the conveying robot 5 that is turned. Accordingly, routing of a harness (wiring) 8 coupled to each sensor can be determined without consideration of the turning motion of the conveying robot 5. As a result, the routing of the harness 8 can be easily determined.

Further, the first sensor 5*h* and the second sensor 5*i* are provided at the sensor support units 5*d* of the second part 5*c* (that is not turned) whose operation system is separated from that of the first part 5*b* of the conveying robot 5 that is turned. Accordingly, the sensor support units 5*d*, the first sensor 5*h*, and the second sensor 5*i* can be added to the conveying robot 5 at a later time. In this case, the first sensor 5*h* and the second sensor 5*i* can be easily provided at low cost.

Further, the light projecting unit 5*ha* and the light receiving unit 5*hb* are attached so that the light projecting unit 5*ha* obliquely emits the light 5*j* relative to the horizontal direction S in the first sensor 5*h*. Thus, the range of detecting the semiconductor wafer 7 can be widened, and the accuracy of detecting the presence or absence of the semiconductor wafer 7 can be improved.

Further, the light projecting unit 5*ha* and the light receiving unit 5*hb* are attached so that the light projecting unit 5*ha* obliquely emits the light 5*j* relative to the horizontal direction S in the first sensor 5*h*. Thus, the range of detecting the semiconductor wafer 7 can be widened. Accordingly, even in the case where the semiconductor wafers 7 are simultaneously conveyed, the semiconductor wafers 7 can be conveyed with a higher degree of detection accuracy.

Further, the monitoring of the presence or absence of the wafer 7 and the monitoring of the positional displacement of the wafer 7 are performed during the conveying operation of the wafer 7 by the conveying robot 5. Thus, the wafer 7 can be conveyed without deteriorating the processing capacity of the diffusion furnace apparatus 1.

(Second Embodiment)

Figure 6:
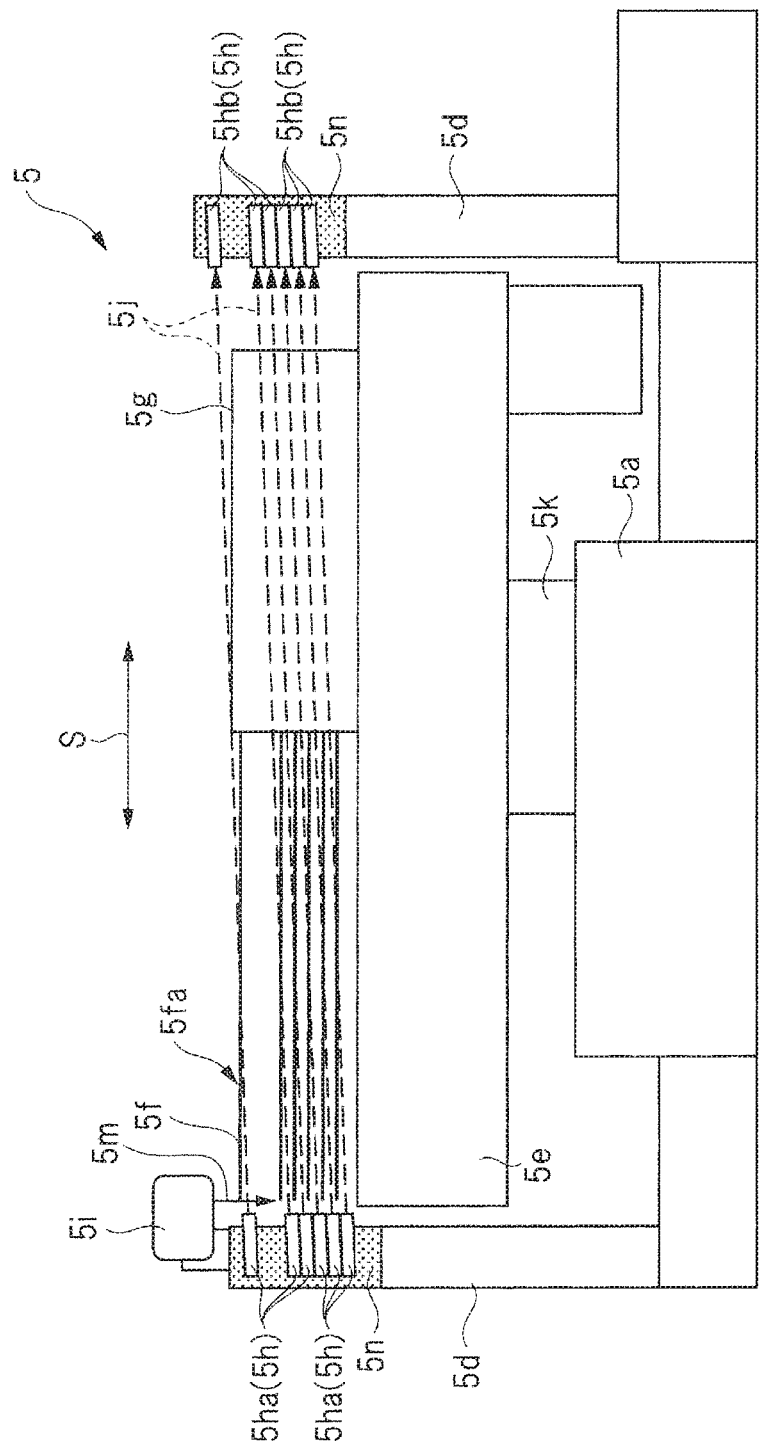
FIG. 6 is a side view for showing an example of a structure of a conveying robot according to a second embodiment.
Figure 7:
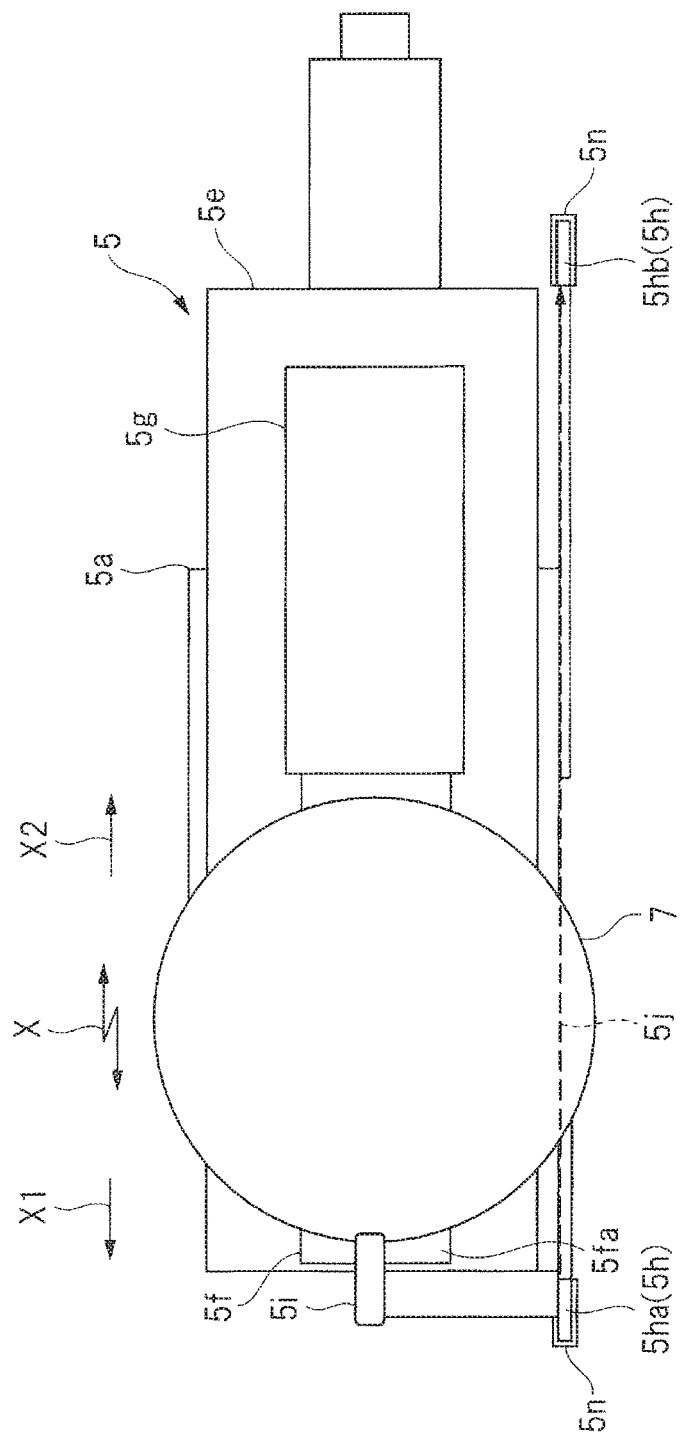
FIG. 7 is a plan view for showing an example of a structure of the conveying robot shown in FIG. 6.

FIG. 6 is a side view for showing an example of a structure of a conveying robot according to a second embodiment, and FIG. 7 is a plan view for showing an example of a structure of the conveying robot shown in FIG. 6.

In a diffusion furnace apparatus 1 of the second embodiment shown in each of FIG. 6 and FIG. 7, a sensor attachment block 5*n* is provided at each of column-like sensor support units 5*d* on the front side X1 and the rear side X2, and light projecting units 5*ha* and light receiving units 5*hb* of a first sensor 5*h* are provided at the sensor attachment blocks 5*n*.

In addition, a plurality of grooves into which the light projecting units 5*ha* and the light receiving units 5*hb* are fitted is formed in the sensor attachment blocks 5*n*. Further, these grooves are formed so that light 5*j* is obliquely emitted from the light projecting unit 5*ha* relative to the horizontal direction S. On the other hand, the grooves into which the light receiving units 5*hb* are fitted are obliquely formed relative to the horizontal direction S in the sensor attachment block 5*n* into which the light receiving units 5*hb* are fitted.

Thus, as shown in the side view of FIG. 6, the light 5*j* emitted from the light projecting unit 5*ha* inclined relative to the horizontal direction S can be received by the light receiving unit 5*hb* that is inclined in the direction similar to the horizontal direction.

This configuration can be easily realized by inclining the attachment postures of the light projecting unit 5*ha* and the light receiving unit 5*hb* to the sensor support units 5*d* relative to the horizontal direction S as similar to the first embodiment. In the second embodiment, both of the light projecting units 5*ha* and the light receiving units 5*hb* can be easily installed while being inclined by a desired angle relative to the horizontal direction S only by fitting each of the light projecting units 5*ha* and the light receiving units 5*hb* into the grooves formed in the sensor attachment blocks 5*n*.

It should be noted that, as shown in the side view of FIG. 6, the light projecting unit 5*ha* is attached to the sensor attachment block 5*n* on the front side X1 so that the emitted light 5*j* obliquely crosses the semiconductor wafer 7. On the other hand, the light receiving unit 5*hb* is also obliquely attached to the sensor attachment block 5*n* on the rear side X2 so that the oblique light 5*j* can be received.

Accordingly, the range of detecting the presence or absence of the semiconductor wafer 7 can be widened even in the diffusion furnace apparatus 1 of the second embodiment.

Further, in the diffusion furnace apparatus 1 of the second embodiment, the number of first sensors 5*h* can be increased or decreased in accordance with the number of plates 5*f* on which the wafers 7 can be arranged. In other words, the number of wafers 7 to be detected can be easily changed in accordance with the number of substrates conveyed by the conveying robot 5 in the diffusion furnace apparatus 1 by changing the sensor attachment blocks 5*n*.

According to the diffusion furnace apparatus 1 of the second embodiment, the first sensor 5*h* detecting the presence or absence of the wafer 7 and the second sensor 5*i* detecting the positional displacement of the wafer 7 are provided in the conveying robot 5 included in the diffusion furnace apparatus 1. Accordingly, the presence or absence of the wafer 7 and the positional displacement of the wafer 7 can be detected in a series of delivery operations of the wafer 7 by the conveying robot 5.

Accordingly, mistakes in the conveyance of the wafer 7 by the conveying robot 5 can be reduced, and the wafer 7 can be prevented from being damaged when the wafer is conveyed.

The other effects obtained by the diffusion furnace apparatus 1 of the second embodiment are hereinafter the same as those obtained by the diffusion furnace apparatus 1 of the first embodiment, and thus the duplicated explanations thereof will be omitted.

(Third Embodiment)

Figure 8:
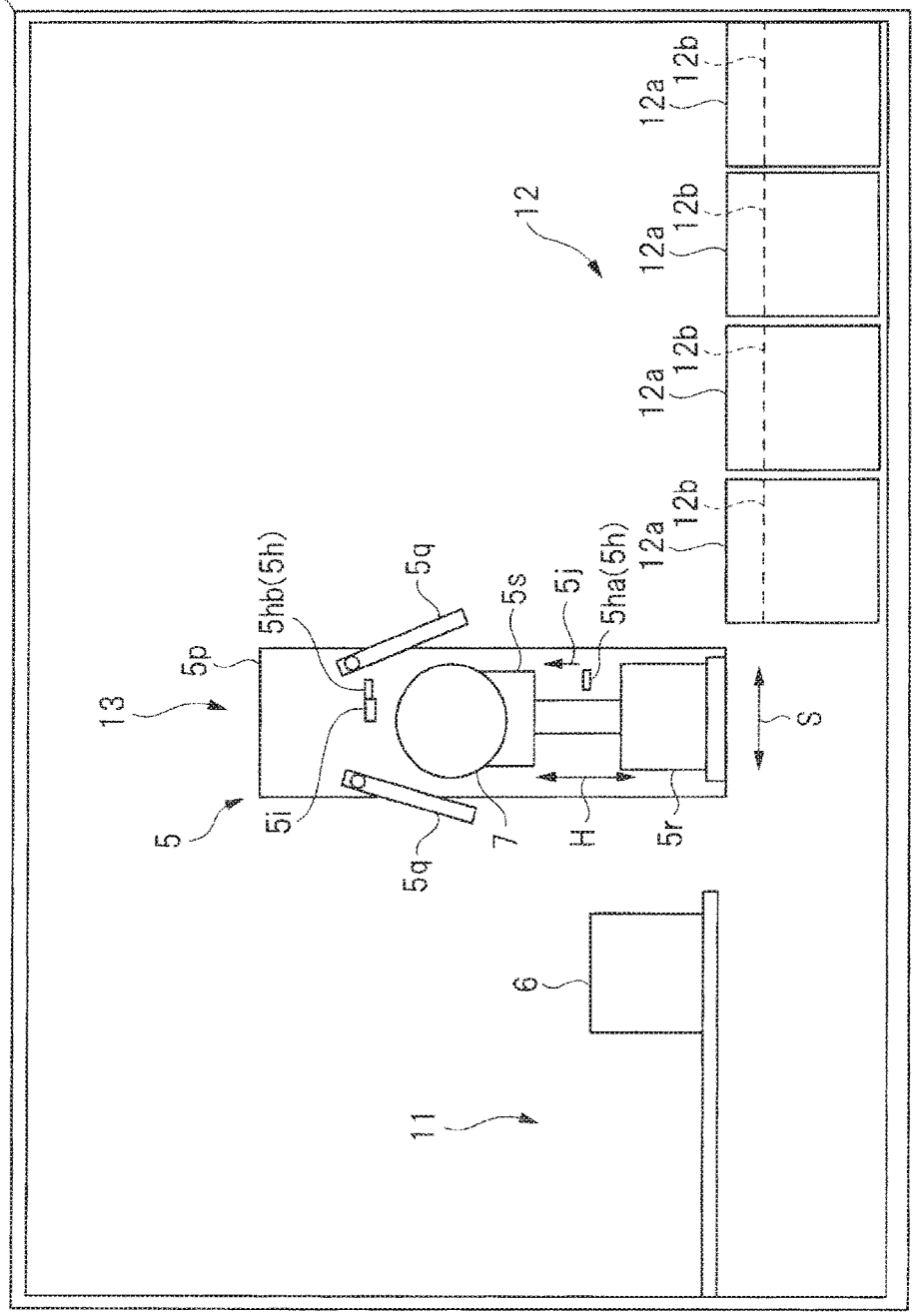
FIG. 8 is a schematic view for showing a structure of a wet cleaning apparatus that is an example of a semiconductor manufacturing apparatus according to a third embodiment.
Figure 9:
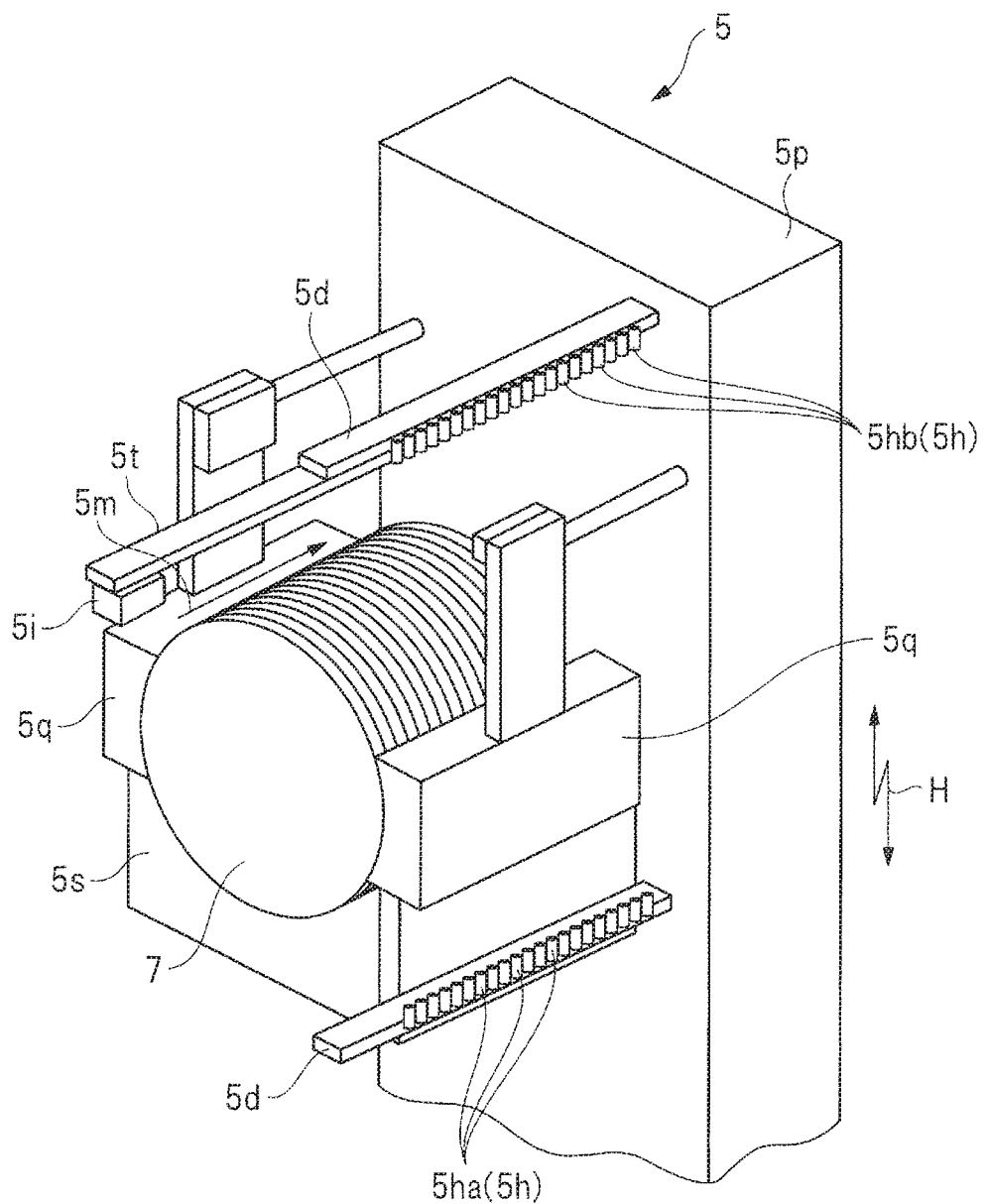
FIG. 9 is a partial perspective view for showing an example of a structure of a conveying robot provided in the semiconductor manufacturing apparatus shown in FIG. 8.

FIG. 8 is a schematic view for showing a structure of a wet cleaning apparatus that is an example of a semiconductor manufacturing apparatus according to a third embodiment, and FIG. 9 is a partial perspective view for showing an example of a structure of a conveying robot provided in the semiconductor manufacturing apparatus shown in FIG. 8.

The semiconductor manufacturing apparatus of the third embodiment shown in FIG. 8 is a wet cleaning apparatus 10 that cleans a semiconductor substrate. A configuration of the wet cleaning apparatus 10 will be described. The wet cleaning apparatus 10 has a substrate carrying-in/carrying-out unit 11 that conveys a semiconductor wafer 7, a wet cleaning unit 12 that is a processing unit to clean the semiconductor substrate, and a substrate conveying unit 13 that delivers the semiconductor substrate between the substrate carrying-in/carrying-out unit 11 and the wet cleaning unit 12.

In addition, the substrate conveying unit 13 includes a conveying robot 5 that delivers a plurality of semiconductor wafers 7 between a cassette (substrate storage container) 6 made of resin that is conveyed from the outside and a cassette (processing jig) 5*r* made of quartz that is soaked in a plurality of liquid tanks 12*a* provided in the wet cleaning unit 12 at the time of cleaning.

Accordingly, the wet cleaning apparatus 10 of the third embodiment cleans the semiconductor wafers 7 in the wet cleaning unit 12 in such a manner that each of the semiconductor wafers 7 is sequentially soaked in the liquid tanks 12*a* in which a cleaning liquid 12*b* such as chemical or pure water is stored.

In addition, the semiconductor wafers 7 are delivered (conveyed) by the conveying robot 5 in the wet cleaning apparatus 10 in a state where the semiconductor wafers 7 are vertically mounted and stored in a lifter unit (substrate holding unit) 5*s* of the conveying robot 5 as shown in FIG. 9.

Next, a configuration of the conveying robot 5 shown in each of FIG. 8 and FIG. 9 will be described. The conveying robot 5 includes the lifter unit 5*s* in which the semiconductor wafers 7 are held (stored) while being vertically mounted, a wafer chuck 5*q* that delivers (conveys) the semiconductor wafers 7 between the cassette 6 and the lifter unit 5*s* while holding the same, and a main body unit 5p that supports the lifter unit 5s and the wafer chuck 5q.

Accordingly, the semiconductor wafers 7 are delivered from the cassette 6 to the cassette 5r in such a manner that the semiconductor wafers 7 stored in the cassette 6 are grasped and taken out upward by the wafer chuck 5q while being vertically mounted in the main body unit 5p of the conveying robot 5. Then, after being taken out, the semiconductor wafers 7 are transferred to the lifter unit 5s of the main body unit 5p while being vertically mounted.

Thereafter, the wafers 7 are moved downward in the height direction H by the lifter unit 5s while being vertically mounted and held, and are transferred to the cassette 5r. In addition, after the wafers 7 are stored in the cassette 5r while being vertically mounted, the main body unit 5p of the conveying robot 5 is moved in the horizontal direction S, and the cassette 5r is arranged on a predetermined liquid tank 12a in the wet cleaning unit 12. After being arranged, the cassette 5r in which the wafers 7 are vertically mounted and stored is moved downward, and is soaked in the cleaning liquid 12b in the liquid tank 12a to clean each of the wafers 7.

In the conveying robot 5 included in the wet cleaning apparatus 10 of the third embodiment, a first sensor 5h and a second sensor 5i are provided as similar to the conveying robot 5 included in the diffusion furnace apparatus 1 of the first embodiment.

Namely, the first sensor 5h of the conveying robot 5 of the wet cleaning apparatus 10 has light projecting units 5ha that emit light 5j and light receiving units 5hb that receive the light 5j as shown in FIG. 8 and FIG. 9. In addition, the light receiving units 5hb and the light projecting units 5ha are provided so as to face each other on the upper side of the lifter unit 5s and on the lower side opposite thereto, respectively.

In the structure shown in FIG. 9, the light projecting units 5h emitting the light 5j are provided at a column-like sensor support unit 5d arranged on the lower side of the semiconductor wafers 7. On the other hand, the light receiving units 5hb receiving the light 5j are provided at another column-like sensor support unit 5d arranged on the upper side of the semiconductor wafers 7. The light projecting units 5ha and the light receiving units 5hb are provided at the column-like sensor support units 5d in association with the number of wafers 7.

Accordingly, as shown in FIG. 8, in the case where the light 5j emitted from the light projecting unit 5ha is blocked by the semiconductor wafer 7, the light 5j cannot be received by the light receiving unit 5hb. Thus, it is determined that the semiconductor wafer 7 is present. On the contrary, in the case where the light 5j emitted from the light projecting unit 5ha is not blocked by the semiconductor wafer 7 but is received by the light receiving unit 5hb, it is determined that the semiconductor wafer 7 is not mounted on the lifter unit 5s.

As described above, whether or not the semiconductor wafer 7 is mounted on the lifter unit 5s, namely, the presence or absence of the semiconductor wafer 7 on the lifter unit 5s is determined (detected).

Further, each of the light projecting units 5ha of the first sensor 5h is provided so that the light 5j is obliquely emitted relative to the vertical direction (height direction H) in a state where the semiconductor wafer 7 is viewed from the side.

Namely, in order to further widen the range of detecting the presence or absence of the semiconductor wafer 7, the light projecting unit 5ha is provided so that the light 5j is obliquely emitted relative to the vertical direction (height direction H), and the light receiving unit 5hb is provided at the position where the light 5j obliquely emitted relative to the vertical direction can be received in the side view of the semiconductor wafer 7.

In other words, the light projecting unit 5ha is obliquely attached to the sensor support unit 5d on the lower side so that the emitted light 5j obliquely crosses an end of the semiconductor wafer 7. On the other hand, the light receiving unit 5hb is also obliquely attached to the sensor support unit 5d on the upper side so that the oblique light 5j can be received.

Next, the second sensor 5i shown in FIG. 9 will be described.

The second sensor 5i is attached so that light 5m is emitted to the semiconductor wafers 7 held by the lifter unit 5s of the conveying robot 5 along the arrangement direction of the semiconductor wafers 7. In this case, the second sensor 5i is of a reflective type as similar to the first embodiment, and includes a light projecting/receiving unit. In addition, the second sensor 5i is attached around a tip end of a column-like sensor support unit 5t arranged along the arrangement direction of the semiconductor wafers 7, and emits the light 5m along the arrangement direction of the semiconductor wafers 7 at a position slightly apart outward in the outer periphery direction from the semiconductor wafers 7.

Namely, the second sensor 5i emits the light 5m along the wafers 7 from the front side of the lifter unit 5s holding the semiconductor wafers 7 to the depth direction, and receives the light 5m reflected from an object to detect the reflection distance.

As similar to the first embodiment, for example, in the case where the light is reflected from a position apart by a predetermined distance, the second sensor 5i does not particularly detect the light, but determines that the wafer 7 is not displaced. On the other hand, in the case where the light is reflected from a position apart by a distance shorter than the predetermined distance, the second sensor 5i detects the light, and determines that any one of the wafers 7 mounted on the lifter unit 5s is displaced.

Namely, in the case where any one of the wafers 7 is displaced, the light 5m is reflected around an end of the displaced wafer 7. Thus, the light 5m is reflected from a position apart by a distance shorter than the predetermined distance. Accordingly, the second sensor 5i detects the light, and determines that the wafer is displaced. On the other hand, in the case where no wafer 7 is displaced, the light 5m is always reflected from a position apart by a predetermined distance, and thus the second sensor 5i does not particularly detect the light.

It should be noted that in the case where, at least, one of the wafers 7 is displaced when the substrate is conveyed in the detection of the positional displacement of the wafer 7, the second sensor 5i detects the positional displacement, and then the conveying robot 5 temporarily stops as similar to the first embodiment.

In the manufacturing method of the semiconductor device according to the third embodiment using the wet cleaning apparatus 10 as described above, when the wafer 7 is delivered by the conveying robot 5 between the cassette (processing jig) 5r made of quartz included in the wet cleaning apparatus 10 and the cassette (substrate storage container) 6 made of resin carried in from the outside, the first sensor 5h detects the presence or absence of the wafer 7, and further the second sensor 5i detects the positional displacement of the wafer 7.

In addition, the monitoring of the presence or absence of the wafer 7 and the monitoring of the positional displacement of the wafer 7 are performed during the conveying operation of the wafer 7 by the conveying robot 5.

According to the wet cleaning apparatus 10 and the manufacturing method of the semiconductor device according to the third embodiment, the first sensor 5h detecting the presence or absence of the wafer 7 and the second sensor 5i detecting the positional displacement of the wafer 7 are provided in the conveying robot 5 included in the wet cleaning apparatus 10. Accordingly, the presence or absence of the wafer 7 and the positional displacement of the wafer 7 can be detected in a series of delivery operations of the wafer 7 by the conveying robot 5.

Accordingly, mistakes in the conveyance of the wafer 7 by the conveying robot 5 can be reduced, and the wafer 7 can be prevented from being damaged when the wafer is conveyed as similar to the first embodiment.

Further, even in the manufacturing apparatus in which the wafer 7 is (vertically) conveyed while being vertically mounted, the presence or absence of the wafer 7 and the positional displacement of the wafer 7 can be detected in a series of delivery operations of the wafer 7 by the conveying robot 5. As a result, mistakes in the conveyance of the wafer 7 by the conveying robot 5 can be reduced, and the wafer 7 can be prevented from being damaged when the wafer is conveyed.

The other effects obtained by the manufacturing method of the semiconductor device and the wet cleaning apparatus 10 of the third embodiment are the same as those obtained in the first embodiment, and thus the duplicated explanations thereof will be omitted.

The invention achieved by the inventors has been described above in detail on the basis of the embodiments. However, it is obvious that the present invention is not limited to the embodiments described above, but can be variously changed without departing from the scope of the present invention.

For example, in the first and second embodiments, the light projecting units 5ha are provided on the front side X1 and the light receiving units 5hb are provided on the rear side X2 in the first sensor 5h of the conveying robot 5 of the diffusion furnace apparatus 1. On the contrary, the light projecting units 5ha and the light receiving units 5hb may be provided on the rear side X2 and the front side X1, respectively.

Further, in the first, second, and third embodiments, the first sensor 5h and the second sensor 5i detect the wafer using the light 5j and the light 5m. However, a laser beam may be used instead of the light 5j and the light 5m.

Further, the number of semiconductor substrates that can be simultaneously conveyed by the conveying robot 5 described in the first, second, and third embodiments is not limited to five, but may be smaller or larger than five.

What is claimed is:

1. A manufacturing method of a semiconductor device comprising:
   (a) delivering a semiconductor substrate using a conveying robot provided in a semiconductor manufacturing apparatus between a processing jig included in the semiconductor manufacturing apparatus and a substrate storage container carried in from the outside; and
   (b) performing a desired process for the semiconductor substrate in a state where the semiconductor substrate is stored in the processing jig in a processing unit of the semiconductor manufacturing apparatus, wherein the conveying robot includes a sensor support unit provided at a part that is not turned, and a first sensor that detects the presence or absence of the semiconductor substrate held by a substrate holding unit of the conveying robot and a second sensor that detects the positional displacement of the semiconductor substrate held by the substrate holding unit are provided at the sensor support unit, and wherein the first sensor detects the presence or absence of the semiconductor substrate, and the second sensor detects the positional displacement of the semiconductor substrate during the delivering of the semiconductor substrate using the conveying robot, wherein the second sensor detects the positional displacement of the semiconductor substrate by emitting light in the vertical direction to the semiconductor substrate held by the substrate holding unit of the conveying robot on the substrate delivery side of the substrate holding unit.

2. The manufacturing method of a semiconductor device according to claim 1,
   wherein the first sensor is a sensor to detect the presence or absence of the semiconductor substrate by projecting or receiving light, and detects the presence or absence of the semiconductor substrate by obliquely emitting the light relative to the horizontal direction.

3. The manufacturing method of a semiconductor device according to claim 1,
   wherein the conveying robot simultaneously conveys a plurality of semiconductor substrates.

4. The manufacturing method of a semiconductor device according to claim 1,
   wherein the processing unit of the semiconductor manufacturing apparatus is a diffusion furnace, and forms a film on the semiconductor substrate in the diffusion furnace in the performing of the desired process for the semiconductor substrate.

5. The manufacturing method of a semiconductor device according to claim 1,
   wherein the processing unit of the semiconductor manufacturing apparatus is a wet cleaning unit, and cleans the semiconductor substrate by soaking the same in a liquid tank in the wet cleaning unit in the performing of the desired process for the semiconductor substrate.

6. The manufacturing method of a semiconductor device according to claim 5,
   wherein the conveying robot delivers the semiconductor substrate to the wet cleaning unit in a state where each of the semiconductor substrates is vertically mounted and stored in the substrate holding unit.

7. A semiconductor manufacturing apparatus comprising:
   a processing unit that processes a semiconductor substrate;
   a processing jig that is arranged in the processing unit to store the semiconductor substrate; and
   a conveying robot that delivers the semiconductor substrate between the processing jig and a substrate storage container carried in from the outside, wherein the processing jig is a jig that stores the semiconductor substrate when a desired process is performed for the semiconductor substrate in the processing unit, and wherein the conveying robot includes a sensor support unit provided at a part that is not turned, and a first sensor that detects the presence or absence of the semiconductor substrate held by a substrate holding unit of the conveying robot and a second sensor that detects the positional displacement of the semiconductor substrate held by the substrate holding unit are provided at the sensor support unit.

8. The semiconductor manufacturing apparatus according to claim 7,
wherein the first sensor has a light projecting unit that emits light and a light receiving unit that receives the light,
wherein the light projecting unit and the light receiving unit are provided so as to face each other on the substrate delivery side of the substrate holding unit and on the side opposite thereto, respectively, and
wherein the light projecting unit is a member that obliquely emits the light relative to horizontal direction.

9. The semiconductor manufacturing apparatus according to claim 7,
wherein the conveying robot includes a plurality of substrate holding units on which a plurality of semiconductor substrates is mounted to simultaneously convey the same, and each of the substrate holding units has a substrate mounting surface.

10. The semiconductor manufacturing apparatus according to claim 7,
wherein the second sensor is a sensor that emits light in the vertical direction to the semiconductor substrate held by the substrate holding unit of the conveying robot on the substrate delivery side of the substrate holding unit.

11. The semiconductor manufacturing apparatus according to claim 7,
wherein the processing unit of the semiconductor manufacturing apparatus is a diffusion furnace that forms a film on the semiconductor substrate.

12. The semiconductor manufacturing apparatus according to claim 7,
wherein the processing unit of the semiconductor manufacturing apparatus is a wet cleaning unit that cleans the semiconductor substrate by soaking the same in a liquid tank.

13. The semiconductor manufacturing apparatus according to claim 12,
wherein the conveying robot has the substrate holding unit in which each of the semiconductor substrates is vertically mounted and stored when the semiconductor substrate is delivered to the wet cleaning unit.

* * * * *